(12) United States Patent
Giussani et al.

(10) Patent No.: US 6,994,803 B2
(45) Date of Patent: Feb. 7, 2006

(54) BALL GRID ARRAY MODULE

(75) Inventors: Luigi Giussani, Milan (IT); Lorenza Lombardi, Milan (IT); Michele Monopoli, Milan (IT); Vittorio Sirtori, Milan (IT); Franco Zambon, Milan (IT)

(73) Assignee: International Business Machines Corporation, Armonk, NY (US)

( * ) Notice: Subject to any disclaimer, the term of this patent is extended or adjusted under 35 U.S.C. 154(b) by 201 days.

(21) Appl. No.: 10/436,591

(22) Filed: May 12, 2003

(65) Prior Publication Data

US 2003/0188430 A1    Oct. 9, 2003

Related U.S. Application Data

(62) Division of application No. 09/666,949, filed on Sep. 20, 2000, now Pat. No. 6,574,860.

(30) Foreign Application Priority Data

Sep. 25, 1999  (GB) ................................. 9922637

(51) Int. Cl.
*C09K 3/00* (2006.01)
*C09K 15/32* (2006.01)
*C11D 17/00* (2006.01)
*H05K 3/30* (2006.01)
*H05K 13/00* (2006.01)

(52) U.S. Cl. ................ 252/383; 252/382; 252/384; 252/400.62; 252/62.3 Q; 252/1; 510/403; 510/404; 510/434; 29/854; 29/832; 257/E21.506; 427/468

(58) Field of Classification Search ................ 252/381, 252/382, 383, 384, 385, 399, 49.3, 49.5, 252/60, 62.3 Q, 1
See application file for complete search history.

(56) References Cited

U.S. PATENT DOCUMENTS

| | | | | |
|---|---|---|---|---|
| 2,405,861 A | * | 8/1946 | Tod | 516/105 |
| 5,374,417 A | * | 12/1994 | Norfleet et al. | 424/49 |
| 5,676,956 A | * | 10/1997 | Duffy et al. | 424/401 |
| 5,683,712 A | * | 11/1997 | Cavazza | 424/449 |
| 5,718,931 A | * | 2/1998 | Walter et al. | 426/102 |
| 5,976,521 A | * | 11/1999 | Briggs et al. | 424/78.07 |
| 6,207,139 B1 | * | 3/2001 | Lee et al. | 424/52 |
| 2005/0001017 A1 | * | 1/2005 | Oggioni | 228/207 |

* cited by examiner

*Primary Examiner*—Joseph D. Anthony
(74) *Attorney, Agent, or Firm*—Scully, Scott, Murphy & Presser; William H. Steinberg

(57) ABSTRACT

The method according to a preferred embodiment of the present invention mitigates the problem of gold contamination during the SMT assembly operations in the manufacture of Hybrid Multi Chip Modules (HMCM), achieving a high assembly process yield. This target is accomplished by protecting, at the first process step, the gold with a thin layer (0.02–0.03 millimeter) of a paste very soluble in water and washing it off.

The protective layer obtained with the above described method is very strong. Furthermore it is very easy to remove, since it is soluble in water.

3 Claims, 1 Drawing Sheet

BALL GRID ARRAY MODULE

CROSS REFERENCE TO COPENDING APPLICATION

This application is a divisional application of Ser. No. 09/666,949, filed Sep. 20, 2000 now U.S. Pat. No. 6,574,860.

FIELD OF THE INVENTION

The present invention relates to a protective paste for the manufacturing of electronic modules and more particularly for the manufacturing of Hybrid Multi Chip Modules.

BACKGROUND OF THE INVENTION

The hybrid organic laminate chip package or Hybrid Multi Chip Module (HMCM) is more and more used in electronics due to its small dimensions and high performance. A hybrid package, as shown in FIG. 1 has a substrate 101 on which at least one Surface Mount Technology (SMT) component 103 and at least one wire bonded chip 105 are mounted together.

SMT is a well known technique for electronic card assembly. SMT usually consists of the following main steps:

Screening of solder paste on the pads of the Printed Circuit Board (PCB). The paste screening is done by means of a stencil which is laid on the substrate and a squeegee (usual a rubber blade) which spread the solder paste on the required spots;

Placement of components on the paste. This operation is performed with dedicated machines, having different speeds and precision according to the component dimension and weight.

Reflow of the solder paste under air or nitrogen, depending on the paste flux. Very active fluxes, that protect the powder alloy from the oxidation, allow an air atmosphere to be used. Normally, this reflow operation is performed at high temperature in the range 200° C.–240° C.

The usual wire bonded chip assembly process comprises substantially the following steps:

Die attaching of the chip to the substrate with thermal adhesive dispensing and curing (i.e. polymerisation). The curing process is usually performed at 150° C. for 3–5 hours.

First and second bonding of the two wire ends respectively to the aluminium pad on the chip (also known as ball bonding operation) and to the gold pad on the substrate (also known as wedge bonding operation). This operation comprises connecting the wire and the pad with the application of a compression force and ultrasonic energy by a vibrating probe.

The bonding operations cause the mutual diffusion of the two metals into each other (gold-gold and gold-aluminium). This diffusion is due to the movement of the surface layer atoms, and it depends strongly on the cleanliness of the surface. In fact the surface contamination of the gold and aluminium pads (i.e. the presence of atoms not belonging to the metal lattice) behaves like a barrier against the atom movement, so decreasing or totally preventing the wire bonding. For this reason the metal pads need to be completely clean for good bonding with the wires.

In a HMCM, where both SMT and wire bonded chip attach processes must be performed, it is usual to do the wire bonded chip attach first, followed by the SMT. As shown in FIG. 2, the presence of the wire bonded chip 105 on the substrate 101 when the SMT process starts, prevents the solder paste being dispensed by screening and an alternative paste dispensing method is needed. This is because the stencil cannot be properly laid on the substrate and the squeegee cannot run on the stencil to dispense the paste on the pads 201. A known alternative dispensing method is the point by point dispensing by means of a syringe, which is a much more expensive process than the screening method. On the other hand the inversion of SMT and wire bonded chip attachment processes would cause problems due to the contamination of the gold pads during the SMT process. This contamination is mainly due to the following factors:

solder paste spreading during the solder paste screening;

solder splattering from SMT components during the solder paste reflow;

organic and tin/lead vapours produced during the solder paste reflow and depositing on the substrate.

Solder splattering, in particular, is a thick and very dangerous contamination, that compromises the gold pads bondability. This unwanted contamination is very difficult to be removed and needs very expensive treatment, e.g. plasma cleaning. Plasma cleaning is a powerful technique applied in several industrial fields, such as mechanics, electronics, optics. Plasma, also called 'fourth state of matter', is produced by applying an energy field to a gas, causing its ionization. The electron and the ions, accelerated by the energetic field, achieve a kinetic energy that can be transferred to the surface of an object that has to be cleaned and, if it is higher than the cohesion force of the surface atoms of the object, the plasma is able to remove them. However it could happen that for cleaning off a hard organic film (like flux residues of the solder paste) it needs to achieve a plasma kinetic energy so high that it overcomes the sputtering threshold of the other materials present on HMCM, so that they are damaged.

It is an object of the present invention to provide a technique which alleviates the above drawbacks.

SUMMARY OF THE INVENTION

According to the present invention, we provide a protective paste for protecting metal circuits during the manufacture of electronic modules comprising a citrate salt dissolved in water and glycerol, the weight ratio between citrate and glycerol being between 0.1 and 2.

Furthermore, according to the present invention we provide a method for manufacturing a multi chip module having on the same substrate at least one wire bonded chip and at least one Surface Mount Technology (SMT) chip, the method comprising the steps of:

protecting the gold circuits and pads to which the wire bonded chip will be connected by dispensing a layer of a protective paste, screening the paste on the circuits by means of a stencil, the paste comprising a citrate salt dissolved in water, and glycerol, the weight ratio between citrate and glycerol being between 0.1 and 2:

drying the layer of dispensed paste;

mounting the SMT chip;

removing the protective layer from the gold circuits and pads;

attaching and connecting the wire bonded chip.

BRIEF DESCRIPTION OF THE DRAWINGS

The above and other advantages of the present invention will be better understood with reference to the following figures, where.

DETAILED DESCRIPTION OF THE PREFERRED EMBODIMENT

Figure 1:
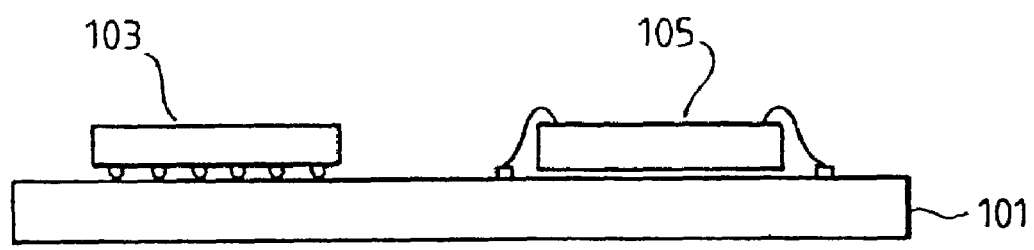
FIG. 1 is a schematic representation of a Hybrid Multi Chip Module (HMCM)
Figure 2:
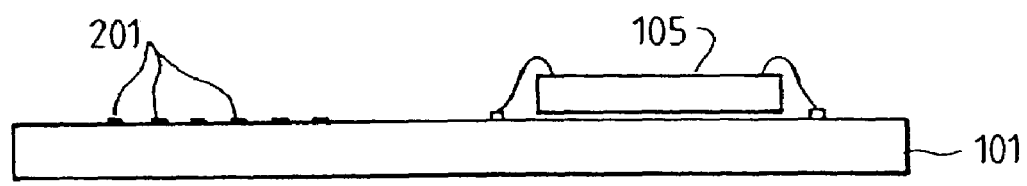
FIG. 2 is a schematic representation of a step of the HMCM manufacturing process when only the wire bonded chip is attached.

The method according to a preferred embodiment of the present invention mitigates the problem of gold contamination during the SMT assembly operations, achieving a high assembly process yield. This target is accomplished by protecting, at the first process step, the gold with a thin layer (0.01–0.04 millimeter) of a paste very soluble in water and washing it off.

Protective pastes actually available on the market, are not suitable for the above purposes because they leave some residues on the surface after peeling and their minimum thickness, that determines the snap off of the stencil during the solder paste screening, is too high (at least 0.070 millimeter) and it reduces the screenability of the solder paste.

The process for the manufacturing of a HMCM according to a preferred embodiment of the present invention has the following steps:

1) protective paste screening on the gold pads;
2) protective paste drying;
3) solder paste screening on SMT pads;
4) SMT component placement;
5) solder paste reflow;
6) chip adhesive dispensing on the chip site;
7) chip adhesive curing (i.e polymerisation)
8) package water washing and removing of the protective paste;
9) U.V. cleaning;
10) wire bonding.

The protective paste according to a preferred embodiment of the present invention is prepared with 3 g of a citrate salt (e.g. sodium or potassium citrate) dissolved in water; 10 g of glycerol is added to this solution which is then heated and stirred until a gel is obtained.

The weight ratio between the citrate salt and the glycerol should be comprised between 0.1 and 2. Water shall be at least enough to dissolve the citrate.

According to a preferred embodiment, the protective paste is dispensed by screening, using a stencil having a thickness of about 100–200 $\mu$m. The paste prepared according to the above method assures a good screenability of the paste and a good protection of the gold pads. One of the main features of the paste according to the present invention is that it is possible to obtain a very thin protective layer (in the range 10–40 $\mu$m). This is partially due to the evaporation of water during the drying step 2 mentioned above. According to a preferred embodiment the protective paste is dried under nitrogen (less than 100 oxygen ppm) with the following thermal profile: between 20° C. and 150° C. for 70 seconds/at 150° C. for 210 seconds/at 200° C. for 150 seconds/between 200° C. and 60 C for 180 seconds; the thickness of the protective layer obtained with the method of the preferred embodiment here described is about 20 micron, thin enough to not affect the consecutive solder paste screening for the SMT process.

The protective layer obtained with the above described method is very strong. Furthermore it is very easy to remove, since it is soluble in water. It should be noted that by removing the protective layer only after the chip has been die attached, another advantage is obtained: the protection of the gold pads by possible contamination of the adhesive vapours produced during the adhesive curing process (i.e. polymerisation).

The U.V. cleaning, mentioned at step 9 has the object of better cleaning the gold pads and it is performed for 10 minutes with a lamp of 350 watt, emitting at 185 and 254 nanometer.

What is claimed is:

1. A protective paste for protecting metal circuits on a printed circuit board during the placement of electronic modules on said printed circuit board, said protective paste consisting essentially of a citrate salt selected from the group of materials consisting of sodium and potassium citrate, said citrate salt being dissolved in water and glycerol and wherein the weight ratio between said citrate salt and glycerol is between about 0.1 and 2.0.

2. The protective paste of claim 1, wherein the weight ratio between said citrate salt and glycerol is between about 0.3 and 0.5.

3. The invention of claim 1 wherein said protective paste is a gel.

* * * * *